United States Patent [19]
Kasakowski et al.
[11] 3,827,047
[45] July 30, 1974

[54] SELF CALIBRATING DIGITAL TO A.C. CONVERTER FOR MULTIPLE CONVERSION

[75] Inventors: Henry R. Kasakowski, Denville; Douglas J. Washburn, Morristown, both of N.J.

[73] Assignee: The Bendix Corporation, Teterboro, N.J.

[22] Filed: Oct. 3, 1973

[21] Appl. No.: 403,246

[52] U.S. Cl. .......... 340/347 DA
[51] Int. Cl. .......... H03k 13/02
[58] Field of Search .......... 340/347 DA, 347 CC

[56] References Cited
UNITED STATES PATENTS

| | | | |
|---|---|---|---|
| 3,047,854 | 7/1962 | Coleman | 340/347 DA |
| 3,105,230 | 9/1963 | MacIntyre | 340/347 DA |
| 3,505,671 | 4/1970 | Forrester et al. | 340/347 DA |
| 3,725,903 | 3/1973 | Kosakowski | 340/347 AD |

*Primary Examiner*—Malcolm A. Morrison
*Assistant Examiner*—R. Stephen Dildine, Jr.
*Attorney, Agent, or Firm*—Anthony F. Cuoco; S. H. Hartz

[57] ABSTRACT

Apparatus for performing multiple digital to a.c. conversions by using a self calibrating feedback loop. The conversions are performed accurately and without the need for a multiplicity of precision components.

8 Claims, 2 Drawing Figures

SELF CALIBRATING DIGITAL TO A.C. CONVERTER FOR MULTIPLE CONVERSION

BACKGROUND OF THE INVENTION

1. Field of the Invention

This invention relates generally to digital to a.c. converters and particularly to converters of the type described including self calibrating means. More particularly, this invention relates to a self calibrating digital to a.c. converter for performing multiple conversions accurately and simply.

2. Description of the Prior Art

Prior to the present invention, apparatus for accurately performing multiple digital to a.c. conversions required the exclusive use of a precision converter for each a.c. output provided. The present invention overcomes this disadvantage by providing multiple a.c. outputs through the use of a single time shared non-precision converter along with conventional non-precision components.

SUMMARY OF THE INVENTION

This invention contemplates a digital to a.c. converter wherein a digital input signal is converted to an analog d.c. signal, and which d.c. signal is stored and multiplied by an a.c. reference signal to provide an analog a.c. output signal related to the digital signal. The a.c. signal is converted to an analog d.c. signal, and which latter signal is converted to a digital signal to close a feedback loop. Errors due to the conversion are eliminated by employing mid-scale and low-scale calibration signals in accordance with the following equation:

$$D_a = (D_a' - C_L)\ ((X/2)/(C_M - C_L)) - X/2, \quad (1)$$

where:

$D_a$ is the calibrated digital signal, $D_a'$ is the uncalibrated digital signal, $C_L$ is a low-scale calibration signal $C_M$ is a mid-scale calibration signal and $X$ is a signal corresponding to the full scale range of the converter.

Closure of the feedback loop is accomplished by subtracting the calibrated digital signal ($D_a$) from a desired digital signal ($D_d$), dividing the result by two and adding the resulting error signal to the previous digital input to the converter ($D_{t-1}$) to provide the digital input signal ($D_t$) in accordance with the following equation:

$$D_t = (D_d - D_a)/2 + D_{t-1} \quad (2)$$

The closed feedback loop thus has the effet of forcing the input digital input ($D_t$) to change so that the desired digital signal ($D_d$) is equal to the actual signal ($D_a$). The actual digital signal is thus an accurate measure of the a.c. output signal from the converter. If the actual and desired d.c. signals are equal then the a.c. signal equals the desired a.c. signal within the accuracy of the calibration. Multiple a.c. outputs may be provided by multiplexing and without the use of further converting means.

One object of this invention is to provide a converter for accurately performing multiple digital to a.c. conversions by employing self calibrating feedback means.

Another object of this invention is to provide the conversions with a minimum number of precision components.

Another object of this invention is to provide the conversions with minimum hardware.

Another object of this invention is to obtain multiple digital to a.c. conversions through the use of a signal digital to analog converter.

The foregoing and other objects and advantages of the invention will appear more fully hereinafter from a consideration of the detailed description which follows, taken together with the accompanying drawings wherein the invention is illustrated by way of example. It is to be expressly understood, however, that the drawings are for illustrated purposes only and are not to be construed as defining the limits of the invention.

DESCRIPTION OF THE INVENTION

Figure 1:
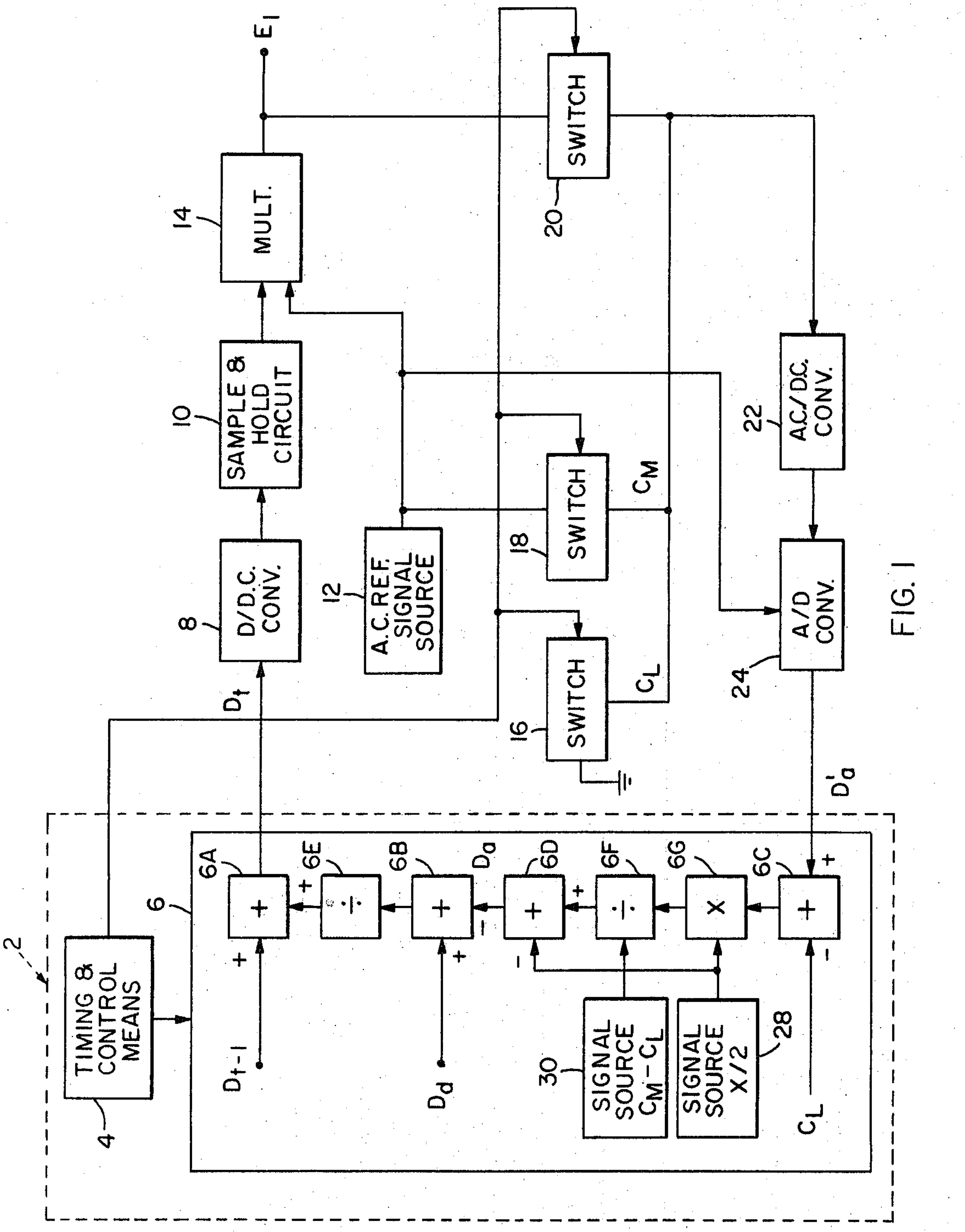
FIG. 1 is a block diagram showing the feature of the invention wherein digital to a.c. conversions are accomplished through the use of a self calibrating feedback loop.

FIG. 1 shows a computer central processing unit designated by the numeral 2 and including timing and control means 4 and arithmetic means 6. Arithmetic means 6 includes summing means 6A, 6B, 6C and 6D, dividing means 6E and 6F and multiplying means 6G. Arithmetic means 6 with the various means 6A to 6G is of a type well known in the art such as described at pages 338–342, Pulse Digital and Switching Waveforms, Millman & Taub, McGraw Hill, 1965. The various functional relationship between means 6A–6G will be hereinafter described.

An input digital signal $D_t$ is provided by summing means 6A of arithmetic means 6. Signal $D_t$ is applied to a digital to analog converter 8 which converts the digital signal to an analog d.c. signal. For this purpose converter 8 may be of the type described at page 675, FIG. 18–4, Millman & Taub, Supra.

The d.c. signal from converter 8 is applied to a conventional type sample and hold circuit 10 and stored thereby. The stored signal and the signal from an a.c. reference signal source 12 are multiplied by a conventional four quadrant multiplier 14 at a peak level of the a.c. reference signal. Multiplier 14 provides an a.c. output signal $E_1$ related to digital signal $D_t$.

A normally open switch 16 is connected to ground, so that when the switch is closed a low-scale calibration point signal designated as $C_L$ is provided at the switch output. A normally open switch 18 is connected to a.c. reference signal source 12 so that when the switch is closed a mid-scale calibration point signal designated as $C_M$ is provided at the switch output. A normally open switch 20 is connected to multiplier 14.

Switches 16, 18 and 20 are controlled by the output from timing and control means 4 so as to be closed in a predetermined sequence whereby low-scale calibration signal $C_L$, mid-scale calibration signal $C_M$ and a.c. signal $E_1$ from multiplier 14 are sequentially applied to an a.c. to d.c. converter 22. For this purpose, converter 22 may be a conventional type rectifier means well known in the art. The d.c. signal from a.c. to d.c. converter 22 is applied to a conventional type analog to digital converter 24 which is connected to reference signal source 12, and which converts the d.c. signal to a digital signal at the peak value of the a.c. reference signal from source 12 to provide a digital signal $D_a'$ which is applied to arithmetic means 6 for purposes as will be hereinafter described.

Any error occuring due to the inaccuracy of converters 22 and 24 is eliminated by using a calibrating procedure described in U.S. Pat. No. 3,725,903 issued to Henry R. Kosakowski on Mar. 27, 1973 and assigned to The Bendix Corporation, assignee of the present invention. Thus, the digital signal from converter 24 is applied to summing means 6C in arithmetic means 6 and assumed thereby with ground or low-scale calibration point signal $C_L$. The output from summing means 6C is applied to a multiplying means 6G and multiplied thereby with a signal from a signal source 28, and which signal corresponds to ½ of the full scale calibration of the converter, $X/2$. The output from multiplying means 6G is applied to dividing means 6F and divided thereby with a signal from a signal source 30 corresponding to the difference between the mid-scale and low-scale calibration points, $C_M - C_L$. The output from summing means 6F is applied to summing means 6D and summed thereby with signal $X/2$ from signal source 28. Summing means 6D provides a signal $D_a$ which corresponds to an actual digital feedback signal. Actual digital feedback signal is thus calibrated in accordace with equation (1) as aforenoted.

Closure of the feedback loop is accomplished by summing means 6B which sums actual digital feedback signal $D_a$ with a desired digital signal $D_d$. The output from summing means 6B is applied to dividing means 6E which divides the output by two. The divided output is an error signal which is applied to summing means 6A and added thereby with the previous digital input to converter 8, $D_{t-1}$, to provide converter input signal $D_t$ in accordance with equation (2) as aforenoted.

The feedback loop thus closed has the effect of forcing signal $D_t$ to change so as to make actual digital signal $D_a$ equal to desired digital signal $D_d$. Actual digital signal $D_a$ is an accurate measure of d.c. signal $E_1$ due to the calibration of converters 22 and 24 as heretofore noted. Therefore, if signal $D_a$ equals signal $D_d$ the a.c. signal $E_1$ equals signal $D_d$ within the accuracy of the calibration of converters 22 and 24.

Figure 2:
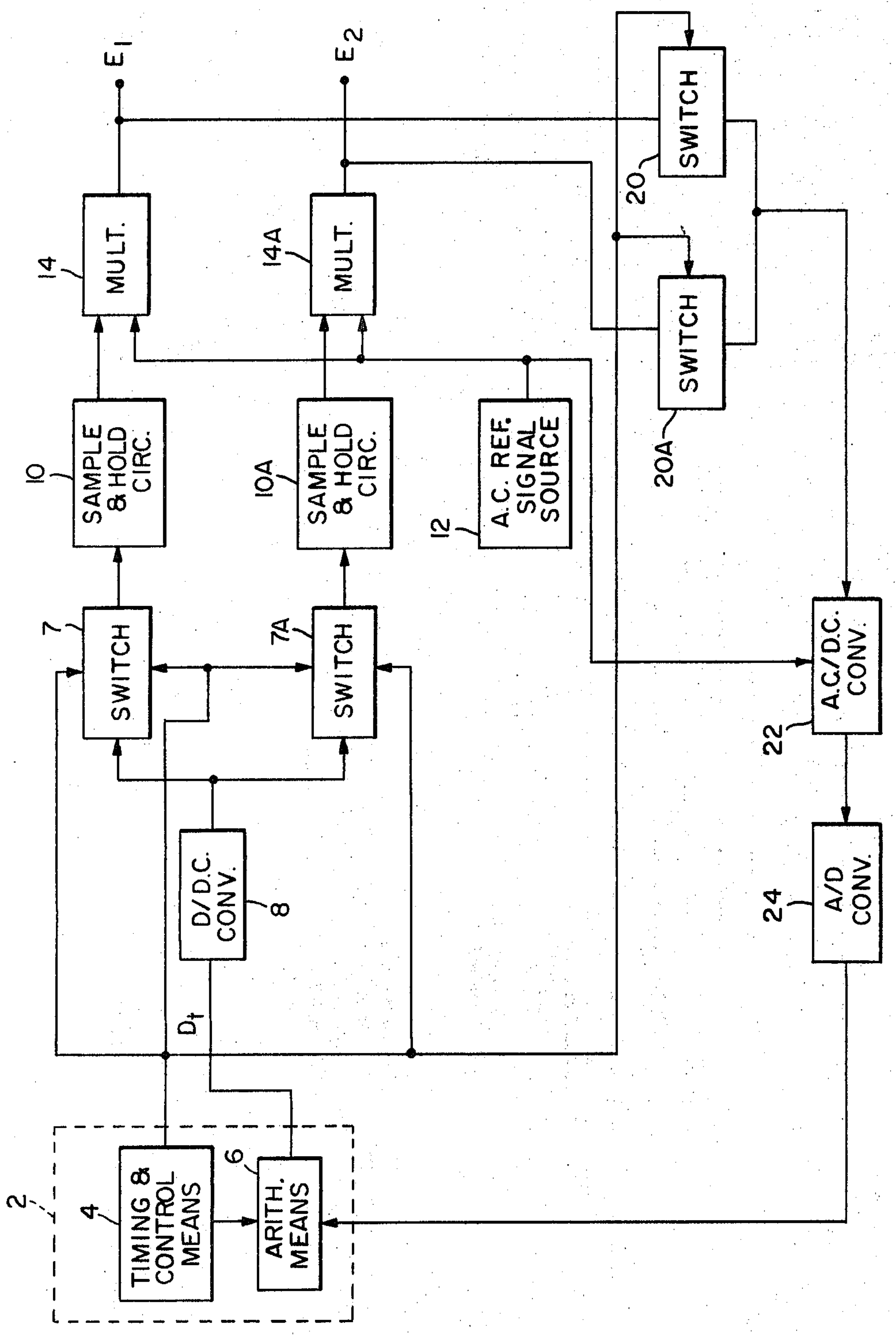
FIG. 2 is block diagram showing the feature of the invention wherein multiple conversions are performed with a minimum of additional hardware.

An important advantage of the invention is that multiple a.c. outputs such as the output $E_1$ can be obtained with a minimum amount of additional hardware. This feature of the invention is best illustrated in FIG. 2.

Thus, signal $D_t$ is applied to digital to d.c. converter 8. Converter 8 is connected through a normally open switch 7 to sample and hold circuit 10, and which sample and hold circuit is connected to multiplier 14 as heretofore described with reference to FIG. 2. Digital to d.c. converter 8 is connected through a normally open switch 7A to a sample and hold circuit 10A, and which sample and hold circuit 10A is connected to a multiplier 14A. A.C. reference signal source 12 is connected to multipliers 14 and 14A.

Switches 7 and 7A are closed in predetermined sequence by the output from timing and control means 4. When switch 7 is so closed signal $E_1$ is provided at the output of multiplier 14 and when switch 7A is so closed $E_2$ is provided at the output of multiplier 14A. Multipliers 14 and 14A are connected through normally open switches 20 and 20A, respectively, to a.c. to d.c. converter 22. Switches 20 and 20A are closed by the output from timing and control means 4 in a predetermined sequence so as to apply one of the signals $E_1$ or $E_2$ to converter 22. The output from converter 22 is thereupon applied to converter 24 and therefrom to arithmetic means 6 for calibration purposes as heretofore described with reference to FIG. 1. It is noted that in the embodiment of the invention shown in FIG. 2, low-scale and mid-scale calibration signals $C_L$ and $C_M$ would be applied through switches 16 and 18 to converter 22 as shown in and described with reference to FIG. 1.

As will now be seen from the aforegoing description of the invention, apparatus is provided which employs a self calibrating feedback loop for accurately performing multiple digital to a.c. conversions. The conversions are performed without the use of precision components and with a minimum amount of hardware. Multiple a.c. outputs may be provided by using a single time shared or multiplexed non-precision d.c. digital to analog converter along with several other conventional and relatively inexpensive non-precision type building blocks.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A closed loop, self calibrating digital to a.c. converter, comprising:

means for providing a digital input signal;

means for providing an analog a.c. output signal related to the digital input signal;

means for converting the analog output signal to a digital signal;

means for providing calibration signals;

means connected to the analog to digital converting means and to the calibrating means and responsive to the digital signal and the calibration signals for providing a calibrated digital signal;

means for providing a desired digital signal;

means for providing a previous digital input signal; and the means for providing the digital input signal connected to the calibrated signal means, the desired digital signal means and the previous digital input signal means, and responsive to the signals therefrom for providing the digital input signal.

2. A converter as described by claim 1, including:

means for providing control signals;

means for providing other calibrating signals;

switching means connected to the means for providing other calibrating signals, to the means for providing an analog output signal, to the control signal means and to the analog to digital converting means, and controlled by the control signals for sequentially applying the calibrating signals and the analog output signal to the analog to digital converting means.

3. A converter as described by claim 1, wherein the means for providing an analog a.c. output signal related to the digital input signal includes:

means for converting the digital signal to a d.c. analog signal;

means for sampling and holding the d.c. analog signal;

means for providing an a.c. reference signal; and means for multiplying the sampled d.c. analog signal and the a.c. reference signal at the peak value of the reference signal to provide the analog output signal related to the digital input signal.

4. A converter as described by claim 1, wherein:

the means for providing calibration signals includes means for providing a low-scale calibration point signal ($C_L$), means for providing a signal corresponding to one-half of the full scale calibrating range ($X/2$) and means for providing a signal corresponding to the difference between the low-scale calibration point and a mid-scale calibration point ($C_M - C_L$); and the calibrated digital signal is provided in accordance with the equation: $D_a = (D_a' - C_L)((X/2)/(C_M - C_L) - X/2$, where $D_a'$ is the digital signal and $D_a$ is the calibrated digital signal.

5. A converter as described by claim 4, wherein:

the means connected to the calibrated digital signal means, the desired digital signal means and the previous digital input signal means, and responsive to the signals therefrom for providing the digital input signal provides said signal in accordance with the equation:

$$D_t = (D_d - D_a)/2 + D_{t-1},$$

where $D_t$ is the digital input signal, $D_d$ is the desired digital signal and $D_{t-1}$ is the previous digital input signal.

6. A closed loop, self calibrating digital to a.c. converter, comprising:

means for providing a digital input signal;

means for providing a plurality of analog a.c. output signals related to the digital input signal;

means for converting one of the analog input signals to a digital signal;

means for providing calibration signals;

means connected to the converting means and to the calibrating means and responsive to the digital signal and the calibration signals for providing a calibrated digital signal;

means for providing a desired digital signal;

means for providing a previous digital input signal; and the means for providing the digital input signal connected to the calibrated signal means, the desired digital signal means and the previous digital signal means, and responsive to the signals therefrom for providing the digital input signal.

7. A converter as described by claim 6, wherein the means for providing a plurality of analog a.c. output signals related to the digital input signal includes:

means for converting the digital signal to a d.c. analog signal;

a plurality of sampling and holding means;

a plurality of switching means, each of said switching means being connected to a corresponding sampling and holding means and to the digital to d.c. converting means;

means for providing control signals connected to each of the plurality of switching means, the signals therefrom controlling each of the plurality of switching means for sequentially applying the analog d.c. signal to a corresponding sampling and holding means;

means for providing an a.c. reference signal; and a plurality of multiplying means, each of which is connected to the reference signal means and to a corresponding sampling and holding means for multiplying the sequentially sampled d.c. analog signal and the a.c. reference signal at the peak value of the reference signal to provide the plurality of analog output signals related to the digital input signal.

8. A converter as described by claim 7, including:

a plurality of switching means, each of which is connected to the control signal means, the analog to digital converting means and to a corresponding multiplying means; and each of said switching means being sequentially operated by the signals from the control signal means for applying the signal from the corresponding multiplying means to the converting means.

* * * * *